United States Patent
Liang et al.

(10) Patent No.: US 11,361,967 B2
(45) Date of Patent: Jun. 14, 2022

(54) UNDERLAYERS FOR EUV LITHOGRAPHY

(71) Applicant: Brewer Science, Inc., Rolla, MO (US)

(72) Inventors: Yichen Liang, Rolla, MO (US);
Andrea M. Chacko, Rolla, MO (US);
Yubao Wang, Rolla, MO (US);
Douglas J. Guerrero, Tombeek (BE)

(73) Assignee: Brewer Science, Inc., Rolla, MO (US)

( * ) Notice: Subject to any disclaimer, the term of this patent is extended or adjusted under 35 U.S.C. 154(b) by 160 days.

(21) Appl. No.: 16/999,223

(22) Filed: Aug. 21, 2020

(65) Prior Publication Data
US 2021/0057219 A1    Feb. 25, 2021

Related U.S. Application Data

(60) Provisional application No. 62/889,964, filed on Aug. 21, 2019.

(51) Int. Cl.
*H01L 21/033* (2006.01)
*H01L 21/027* (2006.01)

(52) U.S. Cl.
CPC ...... *H01L 21/0332* (2013.01); *H01L 21/0274* (2013.01); *H01L 21/0337* (2013.01)

(58) Field of Classification Search
CPC ............. H01L 21/0332; H01L 21/0274; H01L 21/0337; H01L 21/02126; H01L 21/02216; H01L 21/02282; C08G 77/14; C09D 183/06
USPC ............. 430/272.1, 271.1, 270.1, 5; 438/700
See application file for complete search history.

(56) References Cited

U.S. PATENT DOCUMENTS

| | | | |
|---|---|---|---|
| 6,165,695 A | 12/2000 | Yang et al. |
| 8,257,910 B1 | 9/2012 | Guerrero et al. |
| 8,968,989 B2 | 3/2015 | Ouattara et al. |
| 9,281,207 B2 | 3/2016 | Stowers et al. |
| 9,627,217 B2 | 4/2017 | Shigaki et al. |
| 2010/0167212 A1 | 7/2010 | Cho et al. |

(Continued)

FOREIGN PATENT DOCUMENTS

| | | |
|---|---|---|
| EP | 2881794 | 6/2015 |
| JP | 2018-159921 | 10/2018 |
| KR | 10-2010-0079020 | 7/2010 |

OTHER PUBLICATIONS

Liang et al, "Improvement of EUV Si hardmask performance through wet chemistry functionalization," Proc. SPIE 11326, Advances in Patterning Materials and Processes XXXVII, 2020, 1132614, 9 pages.

(Continued)

*Primary Examiner* — Caleen O Sullivan
(74) *Attorney, Agent, or Firm* — Hovey Williams LLP (57) ABSTRACT

New lithographic compositions for use as EUV silicon hardmask layers are provided. The present invention provides methods of fabricating microelectronic structures and the resulting structures formed thereby using EUV lithographic processes. The method involves utilizing a silicon hardmask layer immediately below the photoresist layer. The silicon hardmask layer can either be directly applied to the substrate, or it can be applied to any intermediate layer(s) that may be applied to the substrate. The preferred silicon hardmask layers are formed from spin-coatable, polymeric compositions. The inventive method improves adhesion and reduces or eliminates pattern collapse issues.

20 Claims, 3 Drawing Sheets

(56) References Cited

U.S. PATENT DOCUMENTS

| | | | |
|---|---|---|---|
| 2014/0232018 A1 | 8/2014 | Shigaki et al. | |
| 2014/0377957 A1* | 12/2014 | Takeda | H01L 21/0274 438/703 |
| 2015/0079792 A1* | 3/2015 | Shigaki | G03F 7/091 524/838 |
| 2018/0292753 A1 | 10/2018 | Tanaka et al. | |
| 2018/0366319 A1 | 12/2018 | Coley et al. | |

OTHER PUBLICATIONS

Vanelderen et al., "Underlayer optimization method for EUV lithography," Proc. SPIE 11326, Advances in Patterning Materials and Processes XXXVII, 2020, 1132615, 10 pages.

International Search Report and Written Opinion dated Dec. 2, 2020 in corresponding PCT/US2020/047315 filed Aug. 21, 2020, 11 pages.

\* cited by examiner

|  | DOF= | -8 | -7 | -6 | -5 | -4 | -3 | -2 | -1 | 0 | 1 | 2 | 3 | 4 | 5 | 6 | 7 | 8 |
|---|---|---|---|---|---|---|---|---|---|---|---|---|---|---|---|---|---|---|
|  |  | 30.75 | 32.50 | 34.25 | 36.00 | 37.75 | 39.50 | 41.25 | 43.00 | 44.75 | 46.50 | 48.25 | 50.00 | 51.75 | 53.50 | 55.25 | 57.00 | 58.75 |
| 5 | -0.08 |  |  |  |  |  |  |  |  |  |  |  |  |  |  |  |  |  |
| 4 | -0.06 |  |  |  |  |  |  |  | 17.22 | 16.24 | 15.19 |  |  |  |  |  |  |  |
| 3 | -0.04 |  |  |  |  |  |  | 18.39 | 17.82 | 16.65 | 15.64 | 14.99 | 13.44 |  |  |  |  |  |
| 2 | -0.02 |  |  |  |  |  | 19.12 | 18.53 | 17.73 | 16.83 | 16.12 | 15.36 | 13.96 | 13.50 | 13.45 | 12.85 |  |  |
| 1 | 0.00 |  |  |  |  | 20.93 | 19.54 | 18.58 | 17.68 | 17.14 | 16.29 | 15.72 | 14.92 | 14.24 | 13.76 | 13.17 | 12.53 |  |
| 0 | 0.02 |  |  |  | 20.28 | 20.11 | 19.10 | 18.53 | 17.94 | 17.06 | 16.22 | 15.95 | 15.27 | 14.27 | 13.82 | 13.22 | 12.50 |  |
| -1 | 0.04 |  |  |  | 21.15 | 20.01 | 18.70 | 18.51 | 17.69 | 17.18 | 16.24 | 15.54 | 15.06 | 14.46 | 13.58 | 12.90 | 12.34 |  |
| -2 | 0.06 |  |  |  |  |  | 19.60 | 18.71 | 17.68 | 16.94 | 15.80 | 15.29 | 15.00 | 14.11 | 12.95 | 12.41 |  |  |
| -3 | 0.08 |  |  |  |  |  | 19.77 | 18.61 | 17.51 | 16.63 | 15.73 | 14.14 | 14.44 | 13.65 | 12.81 |  |  |  |
| -4 | 0.10 |  |  |  |  |  | 19.52 | 18.54 | 17.25 | 16.23 | 15.84 | 15.91 | 13.79 | 12.81 |  |  |  |  |
| -5 | 0.12 |  |  |  |  |  | 19.46 | 18.44 | 16.81 | 15.49 | 14.06 | 15.13 | 13.02 |  |  |  |  |  |
|  |  |  |  |  |  |  | 19.6 | 18.6 | 17.6 | 16.8 | 15.9 | 15.5 | 14.8 | 14.3 | 13.7 | 13.1 |  |  |
|  |  | 0.14 | EL= | -6 | -0.38 |  | LWR = | 4.23 |  | BF/BD = | 0.010/46.50 |  |  |  |  |  |  |  |

NR = Not resolved, bridging or scum
C = Collapsed, lines gone
Within target CD

Fig. 3

UNDERLAYERS FOR EUV LITHOGRAPHY

RELATED APPLICATIONS

The present application claims the priority benefit of U.S. Provisional Patent Application Ser. No. 62/889,964, filed Aug. 21, 2019, entitled UNDERLAYERS FOR EUV LITHOGRAPHY, incorporated by reference in its entirety herein.

BACKGROUND OF THE INVENTION

Field of the Invention

This invention relates in general to methods of fabricating microelectronic structures using EUV (extreme ultraviolet) lithography.

Description of Related Art

As the semiconductor industry continues to follow Moore's law, the demand for ever-decreasing feature sizes requires the use of thinner films to prevent pattern collapse. Thinner films will require using a hardmask to transfer the pattern to the substrate. Extreme ultraviolet ("EUV") exposure is expected to be the method of choice for single exposure lithography to achieve the required critical dimension ("CD") targets of the 7-nm node and beyond. Unfortunately, EUV lithography has been hindered by a number of problems, including low throughput, stochastic effects, and adhesion issues.

Traditional trilayer stacks, comprising a carbon-containing layer, a silicon-containing layer, and a photoresist, tend to suffer from poor adhesion between the photoresist and the silicon underlayer, or low etch rates of the silicon hardmask ("Si-HM") layer due to alterations intended to improve adhesion. Spin-on-silicon hardmasks that offer better adhesion to the photoresist as well as high etch rates would provide a fab-friendly solution to improve lithography results and process times.

SUMMARY OF THE INVENTION

The present invention is broadly concerned with silicon hardmask compositions and methods of using those compositions in EUV processes.

In one embodiment, the invention provides a method of forming a structure. The method comprises providing a substrate, with the substrate optionally including one or more intermediate layers thereon. A composition is applied to the substrate, or on the one or more intermediate layers, if present, so as to form a silicon hardmask layer. The composition comprises a polysiloxane comprising:
an adhesion promoting monomer having a structure chosen from one or both of:

where:
each R is individually chosen from $C_1$ to about $C_6$ alkyls and hydrogen;
n is 1 to about 6; and
each X is individually chosen from glycidoxy, epoxy, epoxycycloalkyls, succinic anhydride, acetamido, and isocyanurate moieties; and
one or both of the following:
a surface modification monomer having a structure chosen from one or both of:

where:
each $R_1$ is individually chosen from $C_1$ to about $C_6$ alkyls and from $C_6$ to about $C_{20}$ aryls;
each $R_2$ is individually chosen from $C_1$ to about $C_6$ alkyls and hydrogen;
each $R_3$ is individually chosen from $C_1$ to about $C_6$ alkyls and hydrogen;
m is 1 to about 6; and
each Y is individually chosen from acetoxy, ester, and aryl moieties; and
a densification monomer having a structure chosen from one, two, or three of:

where each $R_4$ is individually chosen from $C_1$ to about $C_6$ alkyls and hydrogen.

A hexamethyldisilizane priming layer is optionally formed on the silicon hardmask layer. A photoresist layer is formed on the hexamethyldisilizane priming layer, if present, or on the silicon hardmask layer if no hexamethyldisilizane priming layer is present, and at least a portion of the photoresist layer is subjected to EUV radiation.

In another embodiment, the method comprises providing a substrate, with the substrate optionally including one or more intermediate layers thereon. A composition is applied to the substrate, or on the one or more intermediate layers, if present, so as to form a silicon hardmask layer. The composition comprises a polysiloxane that comprises:
an adhesion promoting monomer comprising an epoxy functional trialkoxysilane, an anhydride functional trialkoxysilane, an acetamido functional trialkoxysilane, a trialkoxysilylalkyl isocyanurate, and mixtures thereof; and
one or both of:
a tetralkoxysilane; and
a surface modification monomer chosen from dialkoxysilanes, trialkoxysilanes, and combinations thereof.

A hexamethyldisilizane priming layer is optionally formed on the silicon hardmask layer. A photoresist layer is formed on the hexamethyldisilizane priming layer, if present, or on the silicon hardmask layer if no hexamethyldisilizane priming layer is present. At least a portion of the photoresist layer is subjected to EUV radiation.

DETAILED DESCRIPTION

In more detail, the present invention provides silicon hardmask compositions and methods of using those compositions to form microelectronic structures utilizing EUV (i.e., wavelengths of less than about 20 nm and generally about 13.5 nm) lithography processes.

Silicon Hardmark Compositions

1. Polymers for Use in Compositions

Preferred polymers are polysiloxanes that include one or more types of adhesion promoting monomers and one or both of the following: (1) one or more types of surface modification monomers; and/or (2) one or more types of densification monomers.

Preferred adhesion promoting monomers produce a polymer comprising a repeating unit having a structure chosen from one or both of:

where:

each R is individually chosen from $C_1$ to about $C_6$ alkyls (preferably $C_1$ to about $C_3$ alkyls) and hydrogen;

n is 1 to about 6, and more preferably from 1 to about 3; and each X is individually chosen from glycidoxy, epoxy, epoxycycloalkyl (preferably $C_3$ to about $C_{10}$ cycloalkyls, and preferably $C_1$ to about $C_6$ cycloalkyls), succinic anhydride, acetamido, and isocyanurate moieties.

Preferred surface modification monomers produce a polymer comprising a repeating unit having a structure chosen from one or both of:

where:

each $R_1$ is individually chosen from $C_1$ to about $C_6$ alkyls (preferably $C_1$ to about $C_3$ alkyls) and $C_6$ to about $C_{20}$ aryls (preferably $C_6$ to about $C_{14}$ aryls);

each $R_2$ is individually chosen from $C_1$ to about $C_6$ alkyls (preferably $C_1$ to about $C_3$ alkyls) and hydrogen;

each $R_3$ is individually chosen from $C_1$ to about $C_6$ alkyls (preferably $C_1$ to about $C_3$ alkyls) and hydrogen;

m is 1 to about 6, and more preferably from 1 to about 3; and each Y is individually chosen from acetoxy, ester, and aryl moieties. Preferred aryl moieties for Y are $C_6$ to about $C_{20}$, more preferably $C_6$ to about $C_{14}$, and most preferably $C_6$.

Preferred densification monomers produce a polymer comprising a repeating unit having a structure chosen from one, two, or three of:

where each $R_4$ is individually chosen from $C_1$ to about $C_6$ alkyls (preferably $C_1$ to about $C_3$ alkyls) and hydrogen.

It will be appreciated that the ratios and loading of monomers may be tuned to provide the appropriate properties of the final composition. Properties may be adjusted to accommodate various resist types, feature sizes, and feature types (line/space, contact holes, etc.).

In one embodiment, the molar percentage of adhesion promoting monomers or recurring units in the polysiloxane is preferably from about 2% to about 50%, more preferably from about 5% to about 35%, and even more preferably from about 10% to about 20%. The molar percentage of surface modification monomers is preferably from about 5% to about 90%, more preferably from about 10% to about 80%, and even more preferably from about 40% to about 70%. The molar percentage of densification monomers is preferably from about 0% to about 80%, more preferably from about 10% to about 70%, and even more preferably from about 15% to about 50%.

In another embodiment, the molar percentage of adhesion promoting monomers or recurring units in the polysiloxane is preferably from about 2% to about 50%, more preferably from about 5% to about 35%, and more preferably from about 10% to about 20%. The molar percentage of surface modification monomers is preferably from about 0% to about 70%, more preferably from about 10% to about 70%, and even more preferably from about 15% to about 70%. The molar percentage of densification monomers is preferably from about 2% to about 90%, more preferably from about 10% to about 80%, and even more preferably from about 15% to about 70%.

In yet another embodiment, the molar percentage of adhesion promoting monomers or recurring units in the polysiloxane is from about 0% to about 30%, preferably from about 0.01% to about 30%, more preferably from about 0.01% to about 20%, and even more preferably from about 0.1% to about 15%. The molar percentage of surface modification monomers is preferably from about 0% to about 70%, more preferably from about 5% to about 60%, and even more preferably from about 15% to about 50%. The molar percentage of densification monomers is preferably from about 30% to about 95%, more preferably from about 40% to about 80%, and even more preferably from about 50% to about 70%.

In one embodiment, the polysiloxane consists essentially of, or even consists of, one or more types of adhesion promoting monomers, and one or both of: one or more types of surface modification monomers and/or one or more types of densification monomers. In another embodiment, the polysiloxane consists essentially of, or even consists of, one or more types of adhesion promoting monomers, one or more types of surface modification monomers, and one or more types of densification monomers.

2. Polymerization Materials and Methods

The polymer for use in the silicon hardmask compositions are preferably synthesized from hydrolysable silane monomers, with a particularly preferred synthesis method being a sol-gel process. Examples of hydrolysable silane monomers include those selected from the group comprising tetraethoxysilane ("TEOS"), tetramethyl orthosilicate ("TMOS"), methyltrimethoxysilane ("MTMS"), methyltriethoxysilane ("MTEOS"), dimethyldimethoxysilane ("DMDMS"), dimethyldiethoxysilane ("DMDEOS"), phenyltrimethoxysilane ("PTMS"), phenethyltrimethoxy-silane ("PETMS"), 2-(carbomethoxy)ethyltrimethoxysilane ("CMETMS"), acetoxyethyltrimethoxysilane, ethyltrimethoxysilane ("ETMS"), n-butyltrimethoxysilane ("BuTMS"), (3-glycidoxypropyl)trimethoxysilane ("GlyTMS"), 5,6-epoxyhexyltriethoxysilane ("EPOTEOS") 2-(3,4-epoxycyclohexyl)ethyltrimethoxysilane ("ECHTMS"), [3-(triethoxysilyl)propyl]succinic anhydride ("SucTEOS"), (3-acetamidopropyl)trimethoxysilane ("AmiTMS"), (1,3-Di-2-propen-1-yl)-5-(([3-triethoxysilylpropyl])-(1,3,5-triazine-2,4,6 (1H, 3H, 5H)-trione) ("DAICA-TEOS"), and combinations thereof.

As noted previously, the polymers used in these compositions include at least one or more types of adhesion promoting monomers, preferably as copolymers with one or both of: (1) one or more types of surface modification monomers; and (2) one or more types of densification monomers.

Preferred starting compounds for use as adhesion promoting monomers that would form the previously described structures (I) and (II) of the polysiloxanes include trialkoxysilanes (preferably $C_1$ to about $C_6$ alkoxys, and more preferably $C_1$ to about $C_3$ alkoxys) that include high-adhesion functional groups such as epoxies, anhydrides, acetamidos, and/or isocyanurates. Particularly preferred examples of the foregoing are chosen from (3-glycidoxypropyl)trimethoxysilane, 5,6-epoxyhexyl-triethoxysilane, 2-(3,4-epoxycyclohexyl)-ethyltrimethyoxysilane, [3-(triethoxysilyl)propyl]-succinic anhydride, (3-acetamidopropyl)-trimethoxysilane, (1,3-Di-2-propen-1-yl)-5-(([3-triethoxysilylpropyl])-(1,3,5-triazine-2,4,6 (1H, 3H, 5H)-trione), and mixtures thereof.

In embodiments where a surface modification monomer is included, that monomer functions to adjust the surface energy of the hardmask layer formed from the composition, thus providing compatibility between the hardmask layer and the EUV resist in certain embodiments. Preferred such starting compounds for use as a surface modification monomer that would result in structures (III) and (IV) of the polysiloxanes include dialkoxysilanes, trialkoxysilanes, and combinations thereof. In either instance, the alkoxys are preferably $C_1$ to about $C_6$ alkoxys, and more preferably $C_1$ to about $C_3$ alkoxys. It is further preferred that the Si atom of the selected surface modification monomer is bonded with two alkyl, aryl, and/or alkylaryl moieties (in the instance of a dialkoxysilane), or bonded with one alkyl, aryl, or alkylaryl moiety (in the instance of a trialkoxysilane). In either instance, preferred alkyls are $C_1$ to about $C_6$, and preferably $C_1$ to about $C_3$; preferred aryls are $C_6$ to about $C_{20}$, more preferably $C_6$ to about $C_{14}$, and most preferably $C_6$; and preferred alkylaryls are $C_1$ to about $C_6$ (more preferably $C_1$ to about $C_3$) for the alkyl portion and $C_6$ to about Cao (more preferably $C_6$ to about $C_{14}$, and most preferably $C_6$) for the aryl portion. In a further embodiment, the surface modification monomer lacks one or all of epoxy, anhydride, acetamido, and/or isocyanurate functional groups.

Particularly preferred surface modification monomers are chosen from methyltrimethoxysilane, methyltriethoxysilane, dimethyldimethoxy-silane, dimethyldiethoxy-silane, phenyltrimethoxysilane, phenethyl-trimethoxysilane, 2-(carbomethoxy)ethyltrimethoxysilane, acetoxyethyltrimethoxysilane, ethyl-trimethoxysilane, n-butyltrimethoxysilane, and mixtures thereof.

Densification monomers for use in these polymers provide hydrophilic silanol groups and assist in providing thermally driven crosslinking during the post-application bake process by providing crosslinking sites for the structure of the final crosslinked polymer in the cured hardmask layer. Preferred starting compounds for use as densification monomers that would form the previously described structures (V), (VI), and (VII) of the polysiloxanes include tetraalkoxysilanes (preferably $C_1$ to about $C_6$ alkoxys, and more preferably $C_1$ to about $C_3$ alkoxys), with tetraethoxysilane and/or tetramethyl orthosilicate being particularly preferred.

The polymer is synthesized by dissolving the desired monomers as described above in an appropriate polymerization solvent, preferably in quantities to achieve the previously described molar ratios. Polymerization solvents may include, but are not limited to, propylene glycol monomethyl ether acetate ("PGMEA"), propylene glycol methyl ether ("PGME"), propylene glycol ethyl ether ("PGEE"), cyclohexanone, ethyl lactate, propanol, butanol, and mixtures thereof. Water is added to the reaction mixture to hydrolyze the silane monomers while the catalyst for the sol-gel condensation is added simultaneously. Preferably, the $H_2O$/monomer molar ratio range is from about 1:1 to about 10:1, more preferably from about 2:1 to about 8:1. Suitable catalysts include, but are not limited to, mineral acids (such as hydrochloric acid or nitric acid), acetic acid, maleic acid, and combinations thereof. The hydrolysis is preferably allowed to proceed at room temperature for a time of about 1 hour to about 48 hours, more preferably about 4 hours to about 24 hours, and even more preferably about 16 hours. The hydrolyzed monomers are then copolymerized at a temperature of about 40° C. to about 120° C., preferably from about 60° C. to about 100° C., and more preferably about 90° C., for a time period of from about 0.5 hours to about 72 hours, preferably from about 1 hour to about 48 hours, and more preferably from about 5 hours to about 16 hours.

The number average molecular weight (Mn) of the resulting polymer as measured by gas permeation chromatography (GPC) using polystyrene standards is preferably from about 500 g/mol to about 3,000 g/mol, and more preferably from about 800 g/mol to about 2,000 g/mol. The weight-average molecular weight (Mw) range of the polymer as measured by GPC is preferably from about is 600 g/mol to about 10,000 g/mol, more preferably from about 1,000 g/mol to about 8,000 g/mol, and even more preferably from about 1,500 g/mol to about 5,000 g/mol.

3. Composition Preparation

The formed polymer is then dispersed or dissolved in a solvent system to form the silicon hardmask composition. Preferred solvent systems include a solvent selected from the group consisting of PGMEA, PGME, PGEE, propylene glycol n-propyl ether ("PnP"), ethyl lactate, cyclohexanone, gamma-butyrolactone ("GBL"), methyl isobutyl carbinol, and mixtures thereof. The solvent system is preferably utilized at a level of from about 80% to about 99.9% by weight, more preferably from about 90% to about 99.9%, and even more preferably from about 99.0% to about 99.9% by weight, based upon the total weight of the composition taken as 100% by weight. The compositions used to form the silicon hardmask layers will preferably comprise a solids content of from about 0.1% to about 20% by weight solids, more preferably from about 0.1% to about 10% by weight solids, and even more preferably from about 0.1% to about 1.0% by weight solids, based upon the total weight of the composition taken as 100% by weight.

Mixing the above ingredients together in the solvent system forms the silicon hardmask layer composition. Furthermore, any optional ingredients (e.g., surfactants) are also dispersed in the solvent system at the same time.

In some embodiments, additives are utilized. Preferably, the additives are simply mixed into the silicon hardmask layer composition. Preferred additives include catalysts such as benzyltriethylammonium chloride ("BTEAC"), tert-butyl phosphonium bromide ("TBPB"), ethyltriphenylphosphonium bromide ("EtPPB"), and triethoxy-3-(2-imidazolin-1-yl)propylsilane. Another additive that could be used in the hardmask compositions is a photoacid generator ("PAG") such as tris(hydroxyphenyl)sulfonium mesylate, tris(hydroxyphenyl)sulfonium triflate, and combinations thereof. When present, the additives (cumulatively or individually) should be present in the compositions at a level of from about 0.01% to about 2.0% by weight, and preferably from about 0.1% to about 1.0% by weight, based upon the total weight of the solids in the composition taken as 100% by weight.

In one embodiment, the hardmask composition consists essentially of, or even consists of, a polysiloxane, solvent system, catalyst, and photoacid generator. In one embodiment, the hardmask composition consists essentially of, or even consists of, a polysiloxane, solvent system, and catalyst. In a further embodiment, the hardmask composition consists essentially of, or even consists of, a polysiloxane, solvent system, and photoacid generator. In yet a further embodiment, the hardmask composition consists essentially of, or even consists of, a polysiloxane and solvent system.

Methods of Using the Silicon Hardmask Compositions

In the inventive method, a hardmask composition as described above is formed into a layer on a substrate surface, or on an intermediate layer (described below) present on the substrate surface. Any microelectronic substrate can be utilized, but the substrate is preferably a semiconductor substrate, such as silicon, SiGe, $SiO_2$, $Si_3N_4$, SiON, SiCO:H (such as that sold under the name Black Diamond), aluminum, tungsten, tungsten silicide, gallium arsenide, germanium, tantalum, tantalum nitride, $Ti_3N_4$, hafnium, $HfO_2$, ruthenium, indium phosphide, glass, or mixtures of the foregoing. The substrate can have a planar surface, or it can include topographic features (via holes, trenches, contact holes, raised features, lines, etc.). As used herein, "topography" refers to the height or depth of a structure in or on a substrate surface.

A carbon-rich layer may be formed on the substrate or any intermediate layers. The carbon-rich layer can be formed by any known application method, with one preferred method being spin-coating at speeds of about 1,000 to about 5,000 rpm, preferably from about 1,250 to about 1,750 rpm, for a time period of from about 30 to about 120 seconds, preferably from about 45 to about 75 seconds. The term "carbon-rich" refers to layers formed from compositions comprising greater than about 50% by weight carbon, preferably greater than about 70% by weight carbon, and more preferably from about 75% to about 80% by weight carbon, based upon the total solids in the composition taken as 100% by weight. Suitable carbon-rich layers are selected from the group consisting of spin-on carbon layers (SOC), amorphous carbon layers, and carbon planarizing layers.

Exemplary carbon-rich layers will generally compromise a polymer dissolved or dispersed in a solvent system, along with one or more of the following optional ingredients: acid and/or base quenchers, catalysts, crosslinking agents, and surface modification additives. Preferred compositions will be suitable for forming thick layers and preferably have solids content of from about 0.1% to about 70%, more preferably from about 5% to about 40%, and even more preferably from about 10% to about 30% by weight, based upon the total weight of the composition taken as 100% by weight. After the carbon-rich composition is applied, it is preferably heated to a temperature from about 100° C. to about 400° C., and more preferably from about 160° C. to about 350° C. and for a time period of from about 30 seconds to about 120 seconds, preferably from about 45 seconds to about 60 seconds, to evaporate solvents. The thickness (average measurements taken over five locations by an ellipsometer) of the carbon-rich layer after baking is preferably from about 10 nm to about 120 nm, more preferably from about 20 nm to about 100 nm, and even more preferably from about 50 nm to about 60 nm. The carbon-rich layer may be formed by other known application methods, such as chemical vapor deposition ("CVD"), plasma-enhanced chemical vapor deposition ("PECVD"), atomic layer deposition ("ALD"), or plasma-enhanced atomic layer deposition ("PEALD").

The inventive silicon hardmask layer may be applied adjacent to the carbon-rich material or to the substrate or any intermediate layers. The silicon hardmask layer is preferably applied by spin-coating at speeds of about 1,000 rpm to about 3,000 rpm, and preferably from about 1,500 rpm to about 2,000 rpm, for a time period of from about 30 seconds to about 120 seconds, and preferably from about 30 seconds to about 60 seconds. After the silicon hardmask is applied, it is preferably heated to a temperature of about 150° C. to about 300° C., and more preferably from about 200° C. to about 250° C., and for a time period of from about 30 seconds to about 120 seconds, preferably from about 30 seconds to about 60 seconds, to evaporate solvents. During this baking, a sol-gel reaction occurs, thus crosslinking the material. The thickness (average measurements taken over five locations by an ellipsometer) of the hardmask layer after baking is preferably from about 2 nm to about 50 nm, more preferably from about 5 nm to about 30 nm, and even more preferably from about 10 nm to about 25 nm. The hardmask layer should have an etch rate at least about 1.5 times that of the photoresist (e.g., a chemically amplified, metal oxide, or chain scission-type photoresist) in a fluorine-rich plasma atmosphere. Additionally, the carbon-rich layer should have an etch rate that is at least about 1.5 times that of the silicon hardmask layer in an oxygen-rich plasma etch atmosphere.

After the silicon hardmask layer is baked, an EUV photoresist (i.e., imaging layer) can be applied to the silicon hardmask layer to form a photoresist layer. The photoresist layer can be formed by any conventional method, with one preferred method being spin coating the photoresist composition at speeds of from about 350 rpm to about 4,000 rpm (preferably from about 1,000 rpm to about 2,500 rpm) for a time period of from about 10 seconds to about 60 seconds (preferably from about 10 seconds to about 30 seconds). The photoresist layer is then optionally post-application baked ("PAB") at a temperature of at least about 70° C., preferably from about 80° C. to about 150° C., and more preferably from about 100° C. to about 150° C., and for time periods of from about 30 seconds to about 120 seconds. The thickness (average measurements taken over five locations by an ellipsometer) of the photoresist layer after baking will typically be from about 5 nm to about 120 nm, preferably from about 10 nm to about 50 nm, and more preferably from about 20 nm to about 40 nm.

A hexamethyldisilizane ("HMDS") priming process may be applied before coating the photoresist. In this process, the wafer is exposed to HMDS vapor in a sealed chamber while heating at 150° C. for 90 seconds.

The photoresist layer is subsequently patterned by exposure to EUV radiation at a dose of from about 5 mJ/cm$^2$ to about 100 mJ/cm$^2$, preferably from about 10 mJ/cm$^2$ to about 80 mJ/cm$^2$, and more preferably from about 20 mJ/cm$^2$ to about 60 mJ/cm$^2$. More specifically, the photoresist layer is exposed using a mask positioned above the surface of the photoresist layer. The mask has areas designed to permit the EUV radiation to reflect from the mask and contact the surface of the photoresist layer. The remaining portions of the mask are designed to absorb the light to prevent the radiation from contacting the surface of the photoresist layer in certain areas. Those skilled in the art will readily understand that the arrangement of reflecting and absorbing portions is designed based upon the desired pattern to be formed in the photoresist layer and ultimately in the substrate or any intermediate layers.

After EUV exposure, the photoresist layer is preferably subjected to a post-exposure bake ("PEB") at a temperature of less than about 180° C., preferably from about 60° C. to about 140° C., and more preferably from about 80° C. to about 130° C., for a time period of from about 30 seconds to about 120 seconds (preferably from about 30 seconds to about 90 seconds).

The photoresist layer is then contacted with a developer to form the pattern. Depending upon whether the photoresist used is positive-working or negative-working, the developer will either remove the exposed portions of the photoresist layer or remove the unexposed portions of the photoresist layer to form the pattern. The pattern is then transferred to the silicon hardmask layer, any present intermediate layers, and finally the substrate. This pattern transfer can take place via plasma etching (e.g., $CF_4$ etchant, $O_2$ etchant) or a wet etching or developing process. In embodiments where the pattern will be transferred from the photoresist layer to the substrate via etching, it is preferred that the etch rate of the silicon hardmask layer relative to a typical EUV photoresist is at least about 1×, and preferably from about 1.5× to about 2×.

Regardless of whether pattern transfer is effected by etching or by developing, the resulting features have high resolutions. For example, resolutions of less than about 40 nm half pitch, and preferably less than about 30 nm half pitch, can be achieved with the inventive method. The silicon hardmask layer will improve collapse margin of the final features. Collapse margin is quantified by difference from the dose to size from the maximum dose at which structures are still standing, or the minimum dose in the case of negative-tone development resist or negative-tone imaging resist.

Additional advantages of the various embodiments of the invention will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present invention encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Synthesis and Formulation of Silicon Hardmask 1

In this Example, 3.95 grams of TEOS (Gelest, Morrisville, Pa., USA), 7.62 grams of MTMS, (Gelest, Morrisville, Pa., USA), 2.62 grams of PETMS (Gelest, Morrisville, Pa., USA), and 3.54 grams of GlyTMS (Gelest, Morrisville, Pa., USA) were dissolved in 36 grams of PGME (KMG Electronic Chemicals, Fort Worth, Tex., USA). Next, 8.78 grams of 3N acetic acid (VWR, Batavia, Ill.) were dropwise added to the solution to hydrolyze the siloxane monomers, and the solution was kept at room temperature for approximately 16 hours. The reaction was kept under $N_2$ cover and heated to 90° C. for 20 hours to produce Mother Liquor 1. The resulting polymer had a molecular weight of ~2000 and a polydispersity index ("PDI") of 1.6 as measured using TOSOH ECOSEC HLC-8320 gel permeation chromatography with THF as the mobile phase.

Next, 5.89 grams of Mother Liquor 1 were dissolved in 110.9 grams of PGME and 12.88 grams of PGMEA (KMG Electronic Chemicals, Fort Worth, Tex.) (90:10), to which 0.29 gram of TBPB solution (0.2 wt. % in PGME) was added. The formulation as made was mixed overnight on a mixing wheel, with the resulting formulation being about 0.9 wt. % solids.

Example 2

Synthesis and Formulation of Silicon Hardmask 2

In this procedure, 3.95 grams of TEOS, 4.90 grams of MTMS, 6.78 grams of PETMS, and 3.54 grams of GlyTMS were dissolved in 44 grams of PGME. Next, 8.78 grams of 3N acetic acid were dropwise added to the solution to hydrolyze the siloxane monomers, and the solution was kept at room temperature for approximately 16 hours. The reaction was kept under $N_2$ cover and heated to 90° C. for 20 hours to produce Mother Liquor 2. The resulting polymer had a molecular weight of ~2000 and a polydispersity index (PDI) of 1.6 as measured using TOSOH ECOSEC HLC-8320 gel permeation chromatography with THF as the mobile phase.

Next, 5.9 grams of Mother Liquor 2 were dissolved in 110.1 grams of PGME and 12.8 grams of PGMEA (90:10), to which 0.29 gram of TBPB solution (0.2 wt. % in PGME) was added. The formulation as made was mixed overnight on a mixing wheel. The resulting formulation was about 0.9 wt. % solids.

Example 3

Synthesis and Formulation of Silicon Hardmask 3

In this Example, 3.95 grams of TEOS, 7.62 grams of MTMS, 2.26 grams of PETMS, and 3.93 grams of EpoTMS (Gelest, Morrisville, Pa., USA) were dissolved in 35 grams of PGME. Next, 8.78 grams of 3N acetic acid were dropwise added to the solution to hydrolyze the siloxane monomers, and the solution was kept at room temperature for approximately 16 hours. The reaction was kept under $N_2$ cover and heated to 90° C. for 17.5 hours to produce Mother Liquor 3. The resulting polymer had a molecular weight of ~2300 and a polydispersity index (PDI) of 1.7 as measured using TOSOH ECOSEC HLC-8320 gel permeation chromatography with THF as the mobile phase.

Next, 7.0 grams of Mother Liquor 3 were dissolved in 136.8 grams of PGME and 15.9 grams of PGMEA (90:10), to which 0.35 gram of TBPB solution (0.2 wt. % in PGME) was added. The formulation as made was mixed overnight on a mixing wheel, with the resulting formulation being about 0.9 wt. % solids.

Example 4

Synthesis and Formulation of Silicon Hardmask 4

In this procedure, 3.95 grams of TEOS, 8.98 grams of MTMS, and 3.54 grams of GlyTMS were dissolved in 33 grams of PGME. Next, 8.78 grams of 3N acetic acid were dropwise added to the solution to hydrolyze the siloxane monomers, and the solution was kept at room temperature for approximately 16 hours. The reaction was kept under $N_2$ cover and heated to 90° C. for 17.5 hours to produce Mother Liquor 4. The resulting polymer had a molecular weight of ~1500 and a polydispersity index (PDI) of 1.5 as measured using TOSOH ECOSEC HLC-8320 gel permeation chromatography with THF as the mobile phase.

Next, 4.98 grams of Mother Liquor 4 were dissolved in 84.9 grams of PGME and 9.9 grams of PGMEA (90:10), to which 0.26 gram of TBPB solution (0.2 wt. % in PGME) was added. The formulation as made was mixed overnight on a mixing wheel. The resulting formulation was about 1.0 wt. % solids.

Example 5

Synthesis and Formulation of Silicon Hardmask 5

In this Example, 11.4 grams of TEOS, 4.76 grams of MTMS, and 2.36 grams of GlyTMS were dissolved in 29 grams of PGME. Next, 8.78 grams of 3N acetic acid were dropwise added to the solution to hydrolyze the siloxane monomers, and the solution was kept at room temperature for approximately 16 hours. The reaction was kept under $N_2$ cover and heated to 90° C. for 4 hours to produce Mother Liquor 5. The resulting polymer had a molecular weight of 3000 and a PDI of 2.2 as measured using TOSOH ECOSEC HLC-8320 gel permeation chromatography with THF as the mobile phase.

Next, 7.0 grams of Mother Liquor 5 were dissolved in 173.17 grams of PGME and 19.90 grams of PGMEA (90:10) and mixed overnight on a mixing wheel. The resulting formulation was about 0.7 wt. % solids.

Example 6

Synthesis and Formulation of Silicon Hardmask 6

In this procedure, 11.65 grams of TEOS and 7.83 grams of MTEOS (Gelest, Morrisville, Pa., USA) were dissolved in 26 grams of PGME. Next, 8.78 grams of 3N acetic acid were dropwise added to the solution to hydrolyze the siloxane monomers, and the solution was kept at room temperature for approximately 16 hours. The reaction was kept under $N_2$ cover and heated to 90° C. for 4 hours to produce Mother Liquor 6. The resulting polymer had a molecular weight of 2200 and a PDI of 1.0 as measured using TOSOH ECOSEC HLC-8320 gel permeation chromatography with THF as the mobile phase.

Next, 9.42 grams of Mother Liquor 5 were dissolved in 98.77 grams of PGME and 11.81 grams of PGMEA (90:10) and mixed overnight on a mixing wheel, with the resulting formulation being about 1.57 wt. % solids.

Example 7

FTIR Analysis of Silicon Hardmask 1

Figure 1:
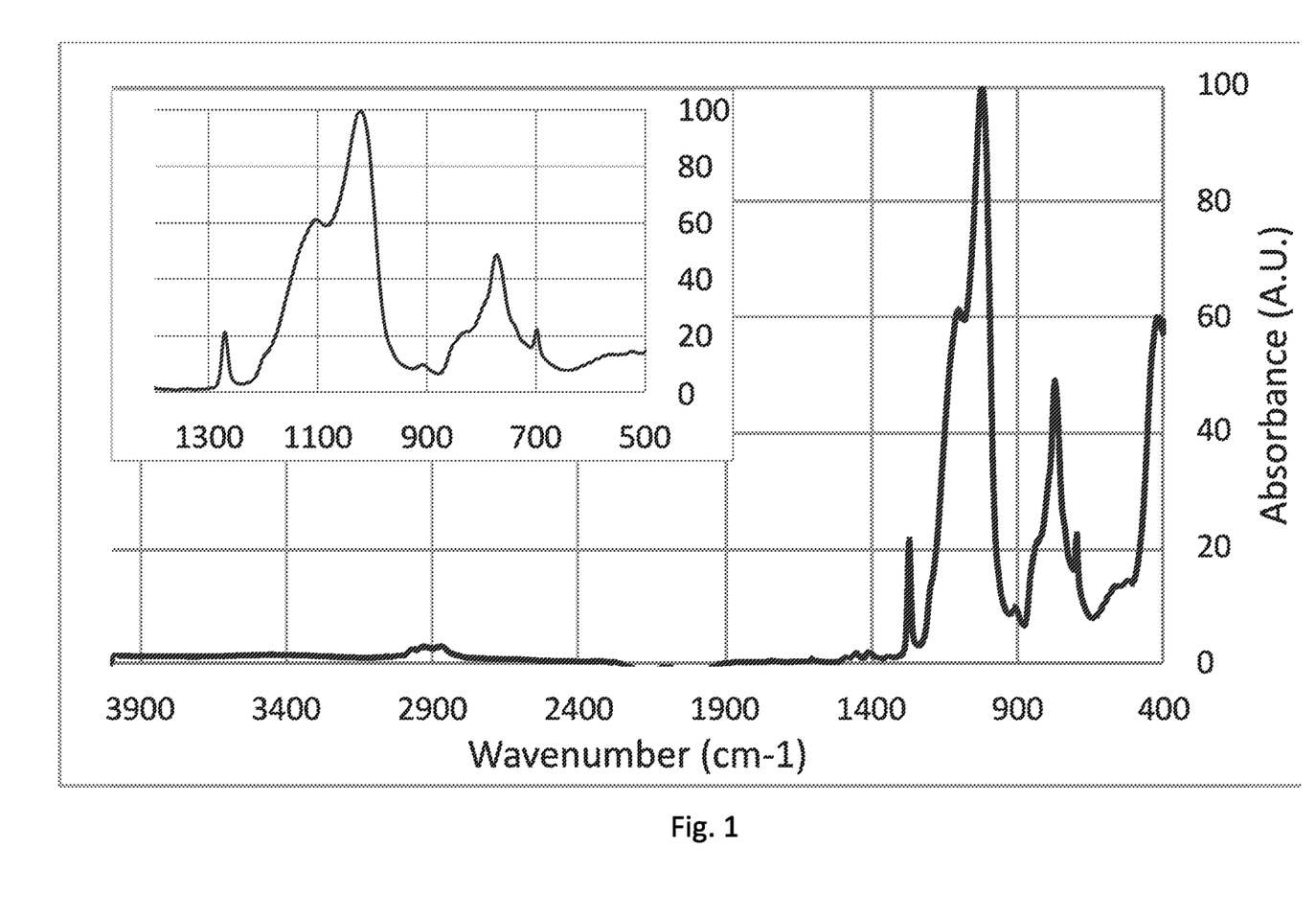
FIG. 1 is the FTIR spectrum for Silicon Hardmask 1 (Example 1)

An FTIR spectrum of the Silicon Hardmask from Example 1 was taken using a Thermal Scientific Nicolet is 50 FTIR spectrometer. To prepare the sample, the formulation from Example 1 was recreated but less solvent was added to reach a solids content of ~10 wt. %, followed by spin coating onto a silicon wafer (NESTEC, test grade) at a spin speed of 1,500 rpm for 60 seconds. After spinning, the layer was baked on a hot plate at 205° C. for 60 seconds to form a crosslinked film. The total thickness of the layer was ~250 nm. Film thickness was measured using a M-2000 Ellipsometer (J. A. Woollam Co., Lincoln, Nebr.). The film was then scratched off the wafer into a powder state. The powder sample was characterized under ATR-FTIR mode. FIG. 1 shows the FTIR spectrum.

Example 8

Characterization of Silicon Hardmask 5

Figure 2:
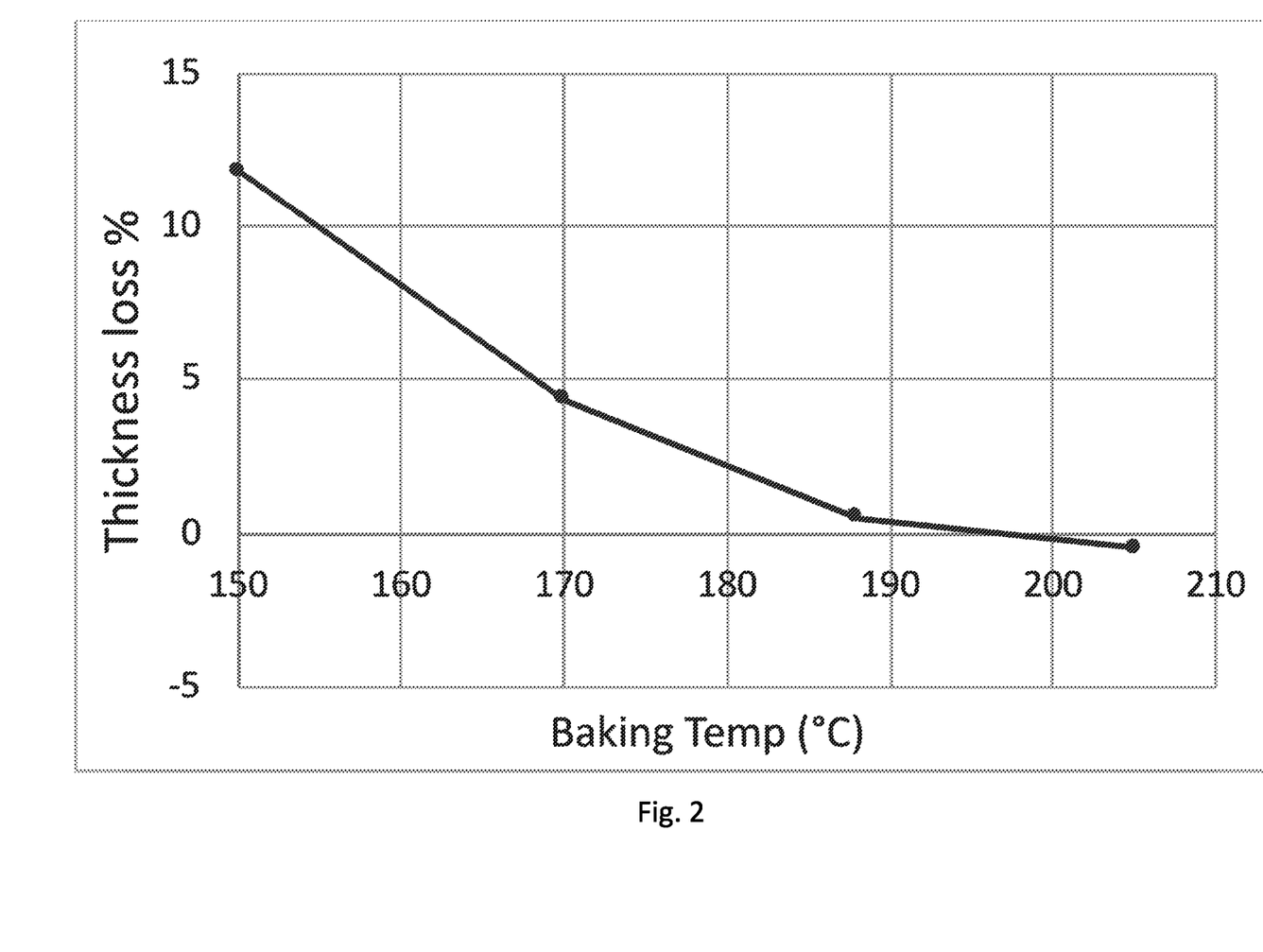
FIG. 2 is a graph showing the crosslinking temperatures tested on Silicon Hardmask 5 (Example 5)

The crosslinking temperature was determined using a strip test with PGME as the stripping solvent. Silicon Hardmask 5 (Example 5) was spin coated at 1,500 rpm onto a substrate and baked at the temperatures shown in FIG. 2. The thickness was determined as described in Example 7. PGME was then pooled on the surface of the wafer and was spin-dried at 1,500 rpm for 60 seconds. The thickness was again determined to see if there was film loss. These results are shown in FIG. 2, with negative thickness loss representing film swelling.

The surface contact angle of Silicon Hardmask 5 was determined using an AST Optima (B5RM5208-143) contact angle measurement tool. The contact angle of the material from Example 5 was measured 5 times in different spots and averaged. Water and methylene iodide were used as the droplet solvent. The final surface contact angle of the material was 61.8 ($H_2O$) and 51.9 ($CH_2I_2$)

Example 9

Lithography Results of Silicon Hardmask 1

Figure 3:
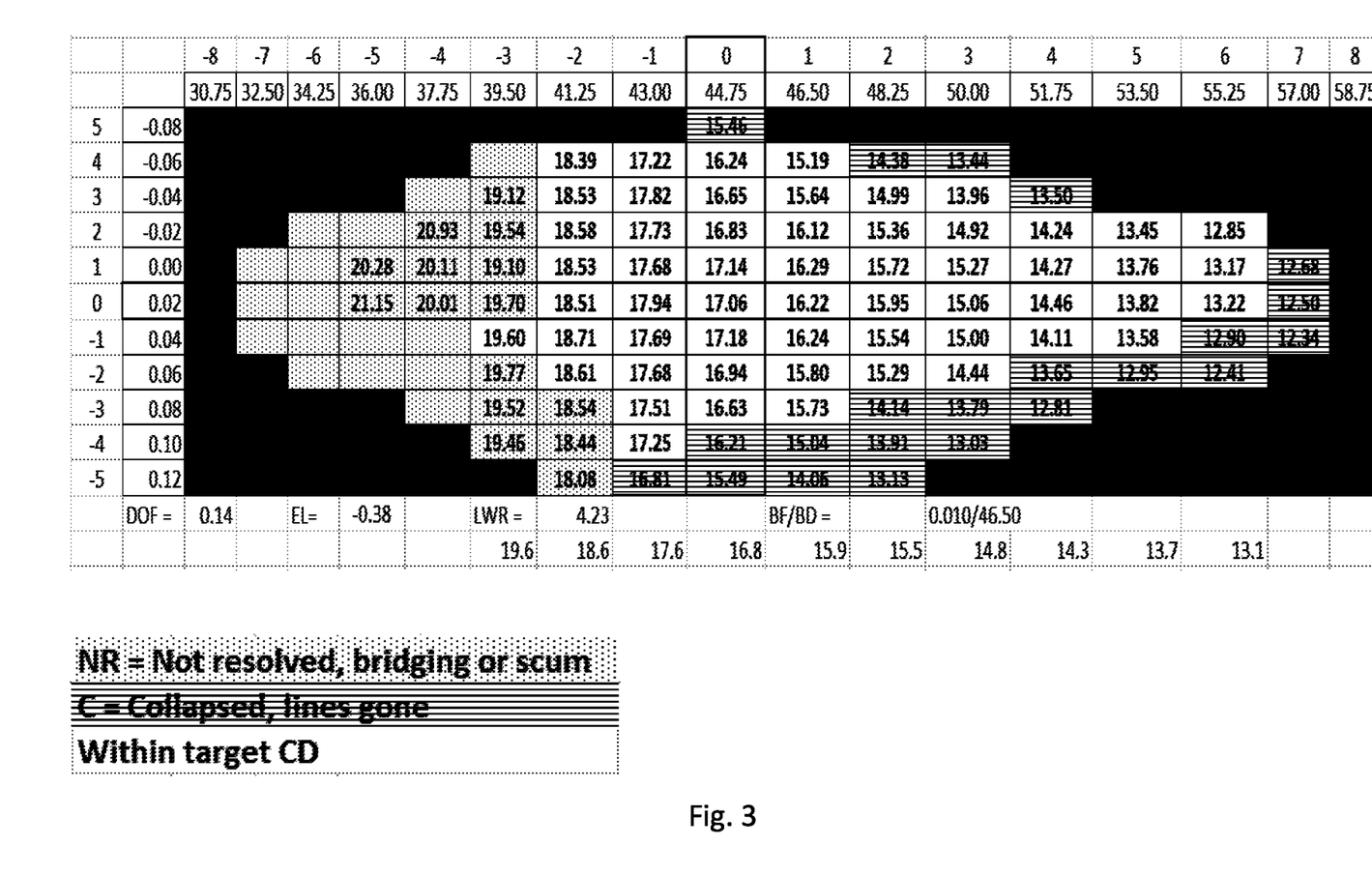
FIG. 3 is a table showing the EUV lithographic photoresist focus exposure matrix ("FEM") measurements of the sample tested in Example 9.

A layer of OptiStack® SOC120 material (Brewer Science, Rolla, Mo.) was spin coated onto a Si wafer by spin coating at 1,486 rpm for 30 seconds and baking at 220° C. for 60 seconds to form a 60-nm film. Silicon Hardmask 1 (Example 1) was spin coated onto a the layer of OptiStack® SOC120 material by spin coating at 1,406 rpm for 30 seconds and baking at 205° C. for 60 seconds to form a 25-nm film. EUV resist JSR4267 (supplied from IMEC) was coated on the hardmask layer by spin coating at 1,040 rpm for 25 seconds, followed by baking at 130° C. for 60 seconds to form a 35-nm coat. The resist was then exposed using the parameters shown in Table 1. A NXE3300 EUV scanner was used for the imaging step and a TEL Pro Z track for the wafer process. FIG. 3 shows the lithography quality using the Example 1 silicon hardmask layer beneath the resist.

TABLE 1

| Parameter | Conditions | Notes |
|---|---|---|
| Resist: | J4267 | |
| Resist thickness (nm): | 35 | |
| Resist coat (rpm/s): | 1040/25 | |
| Target (nm, pitch): | 16L/32P | |
| PAR (° C./s): | 130/60 | |
| PEB (° C./s): | 110/60 | |
| Illumination mode: | Dipole45x | |
| NA: | 0.33 | Free form DOE10490 |
| Sigma (outer/inner): | 0.902/0.671 | |
| Layer | DF | |
| Polarization: | None | |
| Center dose/step (mJ/cm$^2$): | 44.75/1.75 | x-axis |
| Focus offset/step (μm): | 0.02/0.02 | y-axis |
| Reticle bar code: | EUVLINES33R02ADF | Box L5 |
| Dev. Time (s): | OPD262-20 | |
| | Reticle job: | |
| | SUKODO\ | |
| | VV_EUVL33DF_small15x11 | |

We claim:
1. A method of forming a structure, said method comprising:
providing a substrate, said substrate optionally including one or more intermediate layers thereon;
applying a composition to said substrate, or on said one or more intermediate layers, if present, so as to form a silicon hardmask layer, said composition comprising a polysiloxane comprising:
an adhesion promoting monomer having a structure chosen from one or both of:

where:
each R is individually chosen from $C_1$ to about $C_6$ alkyls and hydrogen;
n is 1 to about 6; and
each X is individually chosen from glycidoxy, epoxy, epoxycycloalkyls, succinic anhydride, acetamido, and isocyanurate moieties; and
one or both of the following:
a surface modification monomer having a structure chosen from one or both of:

where:
each $R_1$ is individually chosen from $C_1$ to about $C_6$ alkyls and from $C_6$ to about $C_{20}$ aryls;
each $R_2$ is individually chosen from $C_1$ to about $C_6$ alkyls and hydrogen;

each $R_3$ is individually chosen from $C_1$ to about $C_6$ alkyls and hydrogen;

m is 1 to about 6; and each Y is individually chosen from acetoxy, ester, and aryl moieties; and a densification monomer having a structure chosen from one, two, or three of:

where each $R_4$ is individually chosen from $C_1$ to about $C_6$ alkyls and hydrogen;

optionally forming a hexamethyldisilizane priming layer on said silicon hardmask layer;

forming a photoresist layer on said hexamethyldisilizane priming layer, if present, or on said silicon hardmask layer if no hexamethyldisilizane priming layer is present; and subjecting at least a portion of said photoresist layer to EUV radiation.

2. The method of claim 1, wherein said polysiloxane comprises both of said surface modification monomer and said densification monomer.

3. The method of claim 1, wherein said polysiloxane comprises:
from about 2 mol % to about 50 mol % adhesion promoting monomer;
from about 5 mol % to about 90 mol % surface modification monomer; and
from about 0 mol % to about 80 mol % densification monomer.

4. The method of claim 1, wherein said polysiloxane comprises:
from about 2 mol % to about 50 mol % adhesion promoting monomer;
from about 0 mol % to about 70 mol % surface modification monomer; and
from about 2 mol % to about 90 mol % densification monomer.

5. The method of claim 1, wherein said polysiloxane comprises:
from about 0.01 mol % to about 30 mol % adhesion promoting monomer;
from about 0 mol % to about 70 mol % surface modification monomer; and
from about 30 mol % to about 95 mol % densification monomer.

6. The method of claim 1, wherein said substrate is selected from the group consisting of silicon, SiGe, $SiO_2$, $Si_3N_4$, SiON, SiCO:H, aluminum, tungsten, tungsten silicide, gallium arsenide, germanium, tantalum, tantalum nitride, $Ti_3N_4$, hafnium, $HfO_2$, ruthenium, indium phosphide, glass, and mixtures of the foregoing.

7. The method of claim 1, further comprising forming a pattern in said photoresist layer after said subjecting said photoresist layer to EUV radiation.

8. The method of claim 7, further comprising transferring said pattern to said silicon hardmask layer; to said intermediate layers, if present; and to said substrate.

9. The method of claim 1, wherein an intermediate layer is present, and said intermediate layer is a carbon-rich layer.

10. A method of forming a structure, said method comprising:
providing a substrate, said substrate optionally including one or more intermediate layers thereon;
applying a composition to said substrate, or on said one or more intermediate layers, if present, so as to form a silicon hardmask layer, said composition comprising a polysiloxane that comprises:
an adhesion promoting monomer comprising an epoxy functional trialkoxysilane, an anhydride functional trialkoxysilane, an acetamido functional trialkoxysilane, a trialkoxysilylalkyl isocyanurate, and mixtures thereof; and
one or both of:
a tetralkoxysilane; and
a surface modification monomer chosen from dialkoxysilanes, trialkoxysilanes, and combinations thereof;
optionally forming a hexamethyldisilizane priming layer on said silicon hardmask layer;
forming a photoresist layer on said hexamethyldisilizane priming layer, if present, or on said silicon hardmask layer if no hexamethyldisilizane priming layer is present; and
subjecting at least a portion of said photoresist layer to EUV radiation.

11. The method of claim 10, wherein said tetralkoxysilane is chosen from one or both of tetraethoxysilane or tetramethyl orthosilicate.

12. The method of claim 10, wherein said adhesion promoting monomer is chosen from (3-glycidoxypropyl) trimethoxysilane, 5,6-epoxyhexyl-triethoxysilane, 2-(3,4-epoxycyclohexyl)-ethyltrimethyoxysilane, [3-(triethoxysilyl)propyl]-succinic anhydride, (3-acetamidopropyl)-trimethoxysilane, (1,3-Di-2-propen-1-yl)-5-(([3-triethoxysilylpropyl])-(1,3,5-triazine-2,4,6 (1H, 3H, 5H)-trione), and mixtures thereof.

13. The method of claim 10, said polysiloxane comprising both said tetralkoxysilane and said surface modification monomer.

14. The method of claim 10, wherein said surface modification monomer is chosen from methyltrimethoxysilane, methyltriethoxysilane, dimethyldimethoxysilane, dimethyldiethoxy-silane, phenyltrimethoxysilane, phenethyltrimethoxysilane, 2-(carbomethoxy)ethyltrimethoxy-silane, acetoxyethyltrimethoxysilane, ethyl-trimethoxysilane, n-butyltrimethoxysilane, and mixtures thereof.

15. The method of claim 10, wherein said polysiloxane comprises:
from about 2 mol % to about 50 mol % adhesion promoting monomer;
from about 5 mol % to about 90 mol % surface modification monomer; and
from about 0 mol % to about 80 mol % densification monomer.

16. The method of claim 10, wherein said polysiloxane comprises:
from about 2 mol % to about 50 mol % adhesion promoting monomer;
from about 0 mol % to about 70 mol % surface modification monomer; and
from about 2 mol % to about 90 mol % densification monomer.

17. The method of claim 10, wherein said polysiloxane comprises:

from about 0.01 mol % to about 30 mol % adhesion promoting monomer;

from about 0 mol % to about 70 mol % surface modification monomer; and from about 30 mol % to about 95 mol % densification monomer.

18. The method of claim 10, wherein said substrate is selected from the group consisting of silicon, SiGe, $SiO_2$, $Si_3N_4$, SiON, SiCO:H, aluminum, tungsten, tungsten silicide, gallium arsenide, germanium, tantalum, tantalum nitride, $Ti_3N_4$, hafnium, $HfO_2$, ruthenium, indium phosphide, glass, and mixtures of the foregoing.

19. The method of claim 10, further comprising forming a pattern in said photoresist layer after said subjecting said photoresist layer to EUV radiation.

20. The method of claim 10, wherein an intermediate layer is present, and said intermediate layer is a carbon-rich layer.

\* \* \* \* \*